United States Patent
Chen

(10) Patent No.: US 10,032,704 B2
(45) Date of Patent: Jul. 24, 2018

(54) REDUCING CRACKING BY ADJUSTING OPENING SIZE IN POP PACKAGES

(71) Applicant: Taiwan Semiconductor Manufacturing Co., Ltd., Hsin-Chu (TW)

(72) Inventor: Hsien-Wei Chen, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 14/972,586

(22) Filed: Dec. 17, 2015

(65) Prior Publication Data

US 2016/0240465 A1 Aug. 18, 2016

Related U.S. Application Data

(60) Provisional application No. 62/116,301, filed on Feb. 13, 2015.

(51) Int. Cl.
| | |
|---|---|
| *H01L 23/48* | (2006.01) |
| *H01L 23/498* | (2006.01) |
| *H01L 21/48* | (2006.01) |
| *H01L 23/538* | (2006.01) |
| *H01L 23/00* | (2006.01) |

(Continued)

(52) U.S. Cl.
CPC ...... *H01L 23/49838* (2013.01); *H01L 21/486* (2013.01); *H01L 23/49816* (2013.01); *H01L 23/5389* (2013.01); *H01L 24/00* (2013.01); *H01L 25/105* (2013.01); *H01L 25/50* (2013.01); *H01L 23/3128* (2013.01); *H01L 23/49827* (2013.01); *H01L 2224/04042* (2013.01); *H01L 2224/04105* (2013.01); *H01L 2224/12105* (2013.01); *H01L 2224/19* (2013.01); *H01L 2224/32225* (2013.01); *H01L 2224/48091* (2013.01); *H01L 2224/48227* (2013.01); *H01L 2224/48235* (2013.01); *H01L 2224/49109* (2013.01); *H01L 2224/73265* (2013.01); *H01L 2224/73267* (2013.01); *H01L 2225/1035* (2013.01); *H01L 2225/1041* (2013.01);

(Continued)

(58) Field of Classification Search
CPC ......... H01L 23/49816; H01L 23/49827; H01L 23/49836
USPC .................................................. 257/787, 774
See application file for complete search history.

(56) References Cited

U.S. PATENT DOCUMENTS

| | | | |
|---|---|---|---|
| 5,111,278 A * | 5/1992 | Eichelberger | ......... H01L 23/473 257/698 |
| 8,361,842 B2 | 1/2013 | Yu et al. | |

(Continued)

FOREIGN PATENT DOCUMENTS

| | | |
|---|---|---|
| CN | 101615583 A | 12/2009 |
| CN | 104282649 A | 1/2015 |
| KR | 20130045138 A | 5/2013 |

*Primary Examiner* — Nitin Parekh
(74) *Attorney, Agent, or Firm* — Slater Matsil, LLP

(57) ABSTRACT

A package includes a device die, a molding material molding the device die therein, and a surface dielectric layer at a surface of the package. A corner opening is in the surface dielectric layer. The corner opening is adjacent to a corner of the package. An inner opening is in the surface dielectric layer. The inner opening is farther away from the corner of the package than the corner opening. The corner opening has a first lateral dimension greater than a second lateral dimension of the inner opening.

20 Claims, 20 Drawing Sheets

(51) Int. Cl.
*H01L 25/10* (2006.01)
*H01L 25/00* (2006.01)
H01L 23/31 (2006.01)

(52) U.S. Cl.
CPC ............... *H01L 2225/1058* (2013.01); *H01L 2924/15311* (2013.01)

(56) References Cited

U.S. PATENT DOCUMENTS

| | | | |
|---|---|---|---|
| 8,436,471 B2* | 5/2013 | Chino | H01L 21/565 257/773 |
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,779,606 B2* | 7/2014 | Yim | H01L 23/10 257/686 |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 8,952,544 B2* | 2/2015 | Lin | H01L 21/486 257/774 |
| 9,029,998 B2* | 5/2015 | Jang | H01L 23/34 257/686 |
| 2007/0290376 A1* | 12/2007 | Zhao | H01L 21/56 257/787 |
| 2008/0136004 A1* | 6/2008 | Yang | H01L 24/96 257/686 |
| 2011/0291288 A1 | 12/2011 | Wu et al. | |
| 2012/0074586 A1* | 3/2012 | Seo | H01L 25/16 257/774 |
| 2012/0211885 A1* | 8/2012 | Choi | H01L 23/3128 257/737 |
| 2012/0273957 A1* | 11/2012 | Meyer | H01L 21/486 257/773 |
| 2013/0026468 A1 | 1/2013 | Yoshimuta et al. | |
| 2013/0062760 A1 | 3/2013 | Hung et al. | |
| 2013/0062761 A1 | 3/2013 | Lin et al. | |
| 2013/0099385 A1 | 4/2013 | Chen et al. | |
| 2013/0168848 A1 | 7/2013 | Lin et al. | |
| 2013/0270682 A1* | 10/2013 | Hu | H01L 23/5389 257/666 |
| 2013/0292684 A1* | 11/2013 | Nikitin | H01L 24/03 257/76 |
| 2013/0307140 A1 | 11/2013 | Huang et al. | |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |
| 2014/0273348 A1* | 9/2014 | Yim | H01L 23/10 438/107 |
| 2015/0102503 A1* | 4/2015 | Lin | H01L 21/486 257/774 |
| 2015/0123290 A1* | 5/2015 | Kim | H01L 25/105 257/777 |
| 2015/0187742 A1* | 7/2015 | Kwon | H01L 24/82 257/774 |

* cited by examiner

REDUCING CRACKING BY ADJUSTING OPENING SIZE IN POP PACKAGES

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which adversely affects the yield of the packaging.

Conventional package technologies can be divided into two categories. In the first category, dies on a wafer are packaged before they are sawed. This packaging technology has some advantageous features, such as a greater throughput and a lower cost. Further, less underfill or molding compound is needed. However, this packaging technology also suffers from drawbacks. Since the sizes of the dies are becoming increasingly smaller, and the respective packages can only be fan-in type packages, in which the I/O pads of each die are limited to a region directly over the surface of the respective die. With the limited areas of the dies, the number of the I/O pads is limited due to the limitation of the pitch of the I/O pads. If the pitch of the pads is to be decreased, solder bridges may occur. Additionally, under the fixed ball-size requirement, solder balls must have a certain size, which in turn limits the number of solder balls that can be packed on the surface of a die.

In the other category of packaging, dies are sawed from wafers before they are packaged. An advantageous feature of this packaging technology is the possibility of forming fan-out packages, which means the I/O pads on a die can be redistributed to a greater area than the die, and hence the number of I/O pads packed on the surfaces of the dies can be increased. Another advantageous feature of this packaging technology is that "known-good-dies" are packaged, and defective dies are discarded, and hence cost and effort are not wasted on the defective dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 14A are cross-sectional views of intermediate stages in the manufacturing of packages in accordance with some embodiments;

DETAILED DESCRIPTION

Figure 1:
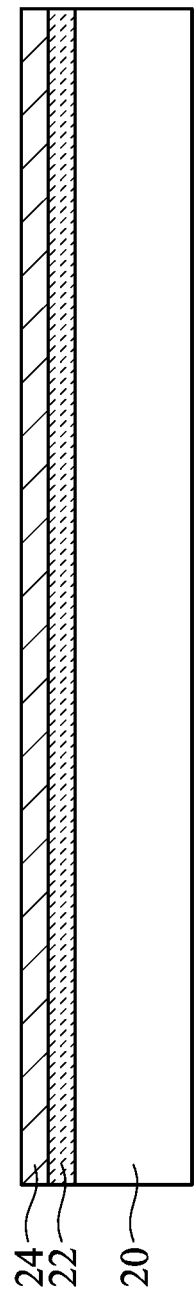

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated fan-out package is provided in accordance with various exemplary embodiments. The variations of the embodiments are discussed. Throughout the various views and illustrative embodiments, like reference numbers are used to designate like elements.

Figure 16:
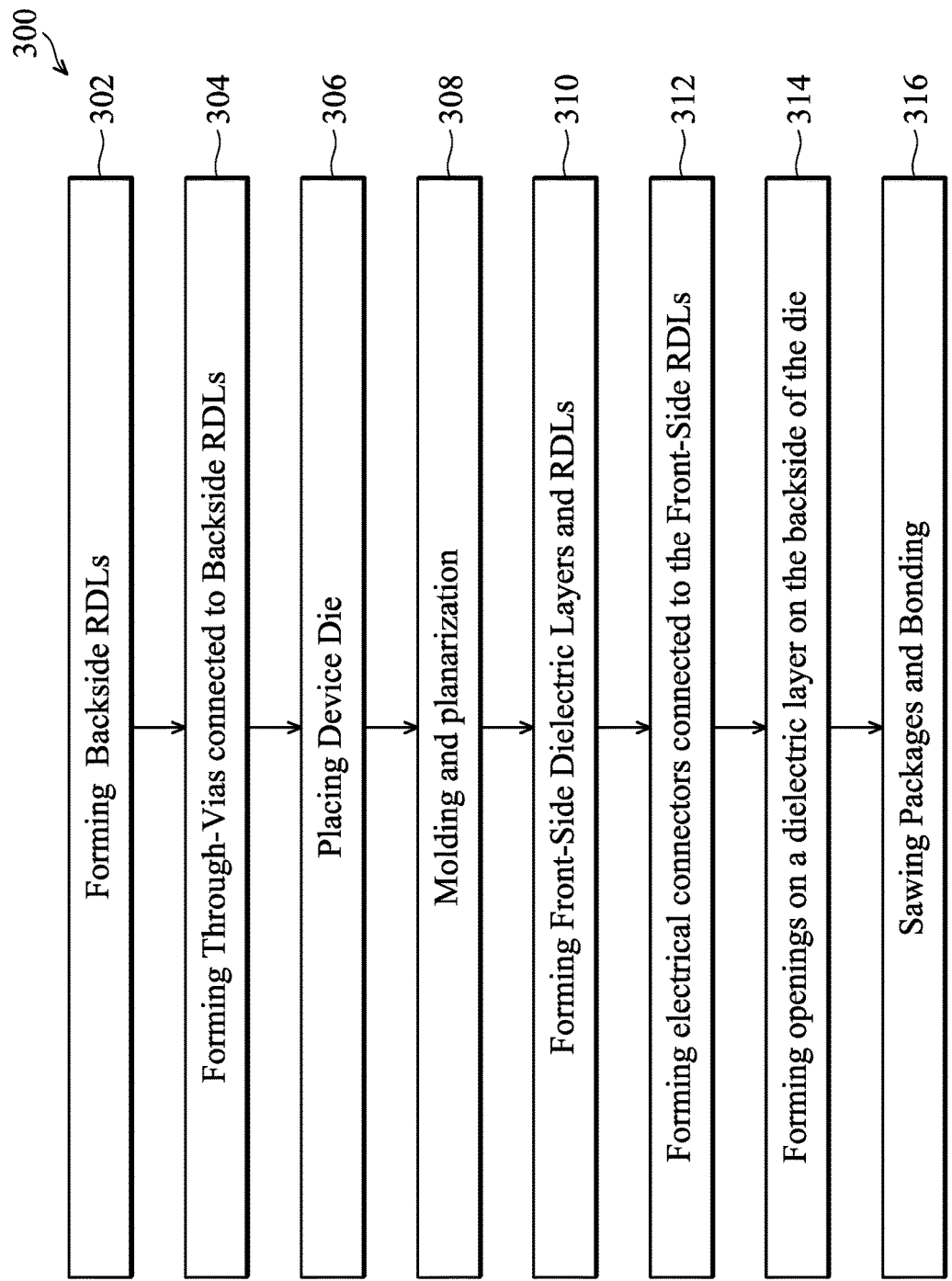
FIG. 16 illustrates a process flow for forming a package in accordance with some embodiments.

FIGS. 1 through 14A illustrate the cross-sectional views and top views of intermediate stages in the manufacturing of a package in accordance with embodiments. The steps shown in FIG. 1 through 14A are also illustrated schematically in the process flow 300 shown in FIG. 16. In the subsequent discussion, the process steps shown in FIGS. 1 through 14A are discussed, referring to the process steps in FIG. 16.

FIG. 1 illustrates carrier 20 and release layer 22 formed on carrier 20. Carrier 20 may be a glass carrier, a ceramic carrier, or the like. Carrier 20 may have a round top-view shape and may be a size of a silicon wafer. For example, carrier 20 may have an 8-inch diameter, a 12-inch diameter, or the like. Release layer 22 may be formed of a polymer-based material (such as a Light To Heat Conversion (LTHC) material), which may be removed along with carrier 20 from the overlying structures that will be formed in subsequent steps. In accordance with some embodiments of the present disclosure, release layer 22 is formed of an epoxy-based thermal-release material. In other embodiments, release layer 22 is formed of an ultra-violet (UV) glue. Release layer 22 may be dispensed as a liquid and cured. In alternative embodiments, release layer 22 is a laminate film and is laminated onto carrier 20. The top surface of release layer 22 is leveled and has a high degree of co-planarity.

Dielectric layer 24 is formed on release layer 22. In accordance with some embodiments of the present disclosure, dielectric layer 24 is formed of a polymer, which may also be a photo-sensitive material such as polybenzoxazole (PBO), polyimide, benzocyclobutene (BCB), or the like, that may be easily patterned using a photo lithography process. In alternative embodiments, dielectric layer 24 is formed of a nitride such as silicon nitride, an oxide such as silicon oxide, PhosphoSilicate Glass (PSG), BoroSilicate Glass (BSG), Boron-doped PhosphoSilicate Glass (BPSG), or the like.

Figure 2:
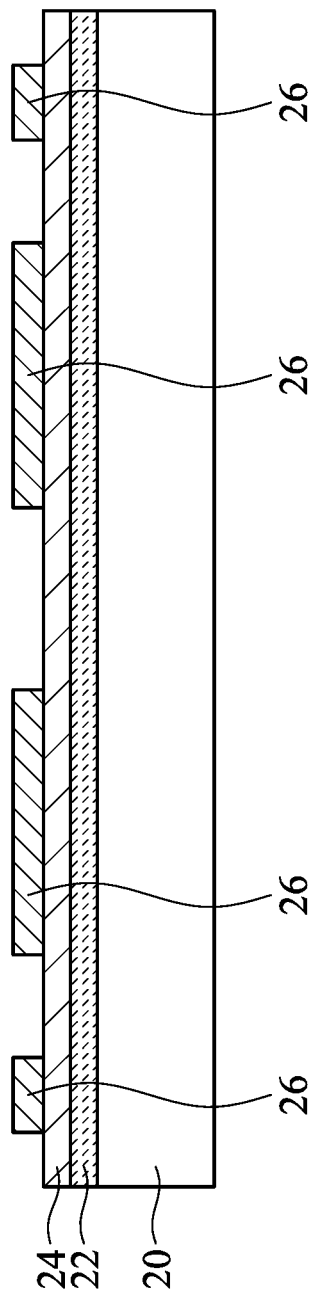
Figure 5:
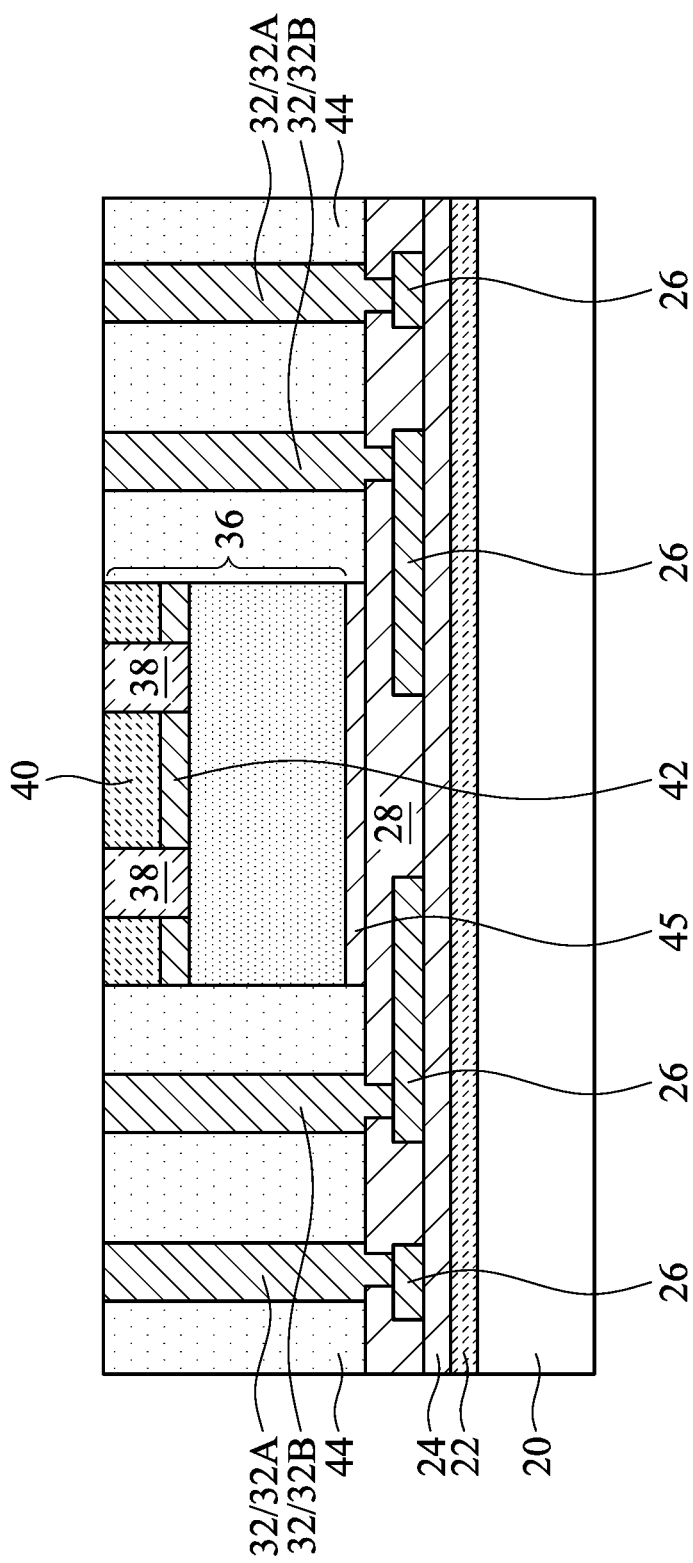

Referring to FIG. 2, Redistribution Lines (RDLs) 26 are formed over dielectric layer 24. The respective step is shown as step 302 in the process flow shown in FIG. 16. RDLs 26 are also referred to as backside RDLs since they are located on the backside of device die 36 (FIG. 5). The formation of RDLs 26 may include forming a seed layer (not shown) over dielectric layer 24, forming a patterned mask (not shown) such as a photo resist over the seed layer, and then performing a metal plating on the exposed seed layer. The patterned mask and the portions of the seed layer covered by the patterned mask are then removed, leaving RDLs 26 as in FIG. 2. In accordance with some embodiments of the present disclosure, the seed layer includes a titanium layer and a copper layer over the titanium layer. The seed layer may be formed using, for example, Physical Vapor Deposition (PVD). The plating may be performed using, for example, electro-less plating.

Figure 3:
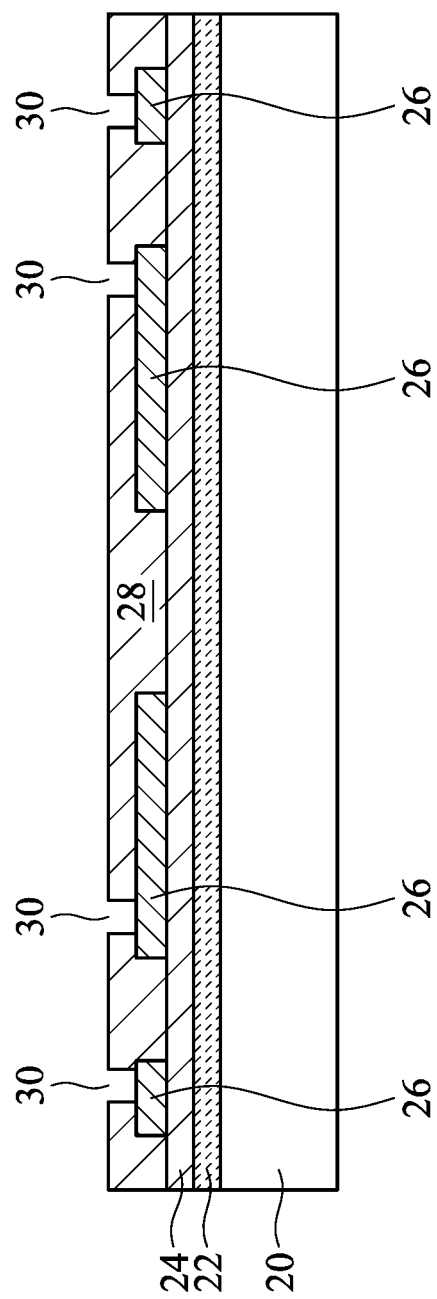

Referring to FIG. 3, dielectric layer 28 is formed on RDLs 26. The bottom surface of dielectric layer 28 may be in contact with the top surfaces of RDLs 26 and dielectric layer 24. In accordance with some embodiments of the present disclosure, dielectric layer 28 is formed of a polymer, which may be a photo-sensitive material such as PBO, polyimide, BCB, or the like. In alternative embodiments, dielectric layer 28 is formed of a nitride such as silicon nitride, an oxide such as silicon oxide, PSG, BSG, BPSG, or the like. Dielectric layer 28 is then patterned to form openings 30 therein. Hence, some portions of RDLs 26 are exposed through the openings 30 in dielectric layer 28.

Figure 4:
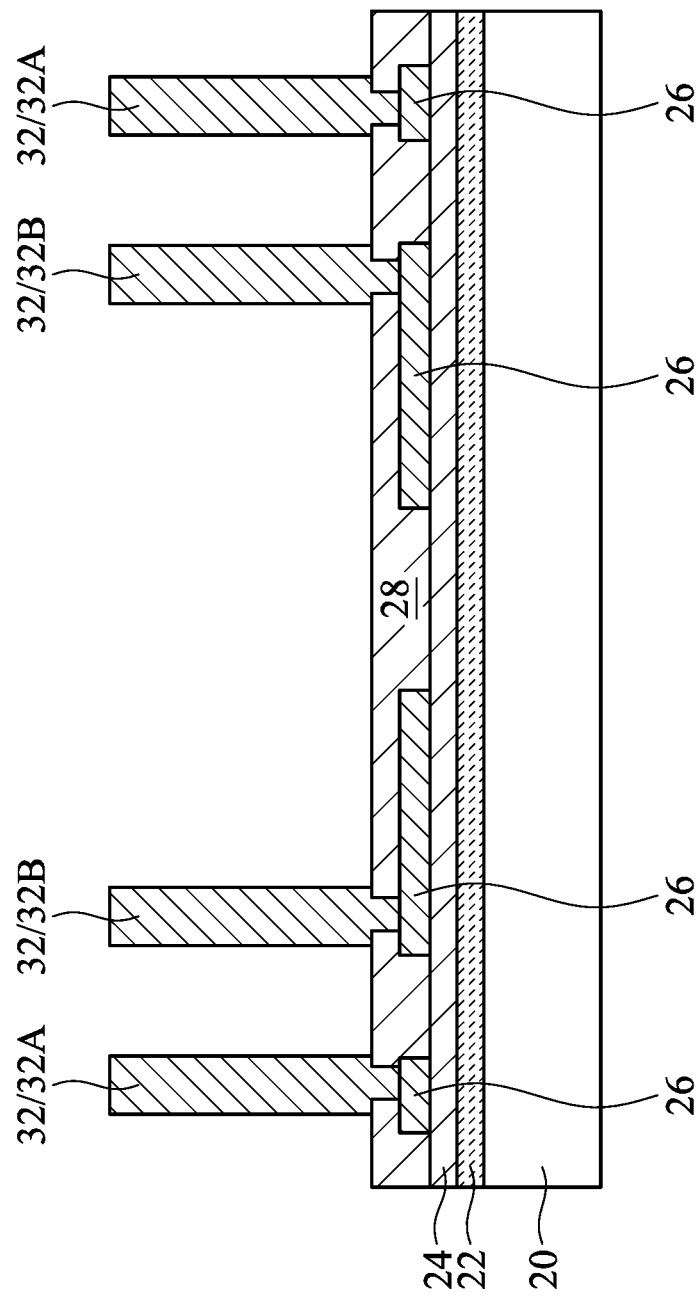

Referring to FIG. 4, metal posts 32 (including 32A and 32B) are formed. Throughout the description, metal posts 32 are alternatively referred to as through-vias 32 since metal posts 32 penetrate through the subsequently formed molding material. In accordance with some embodiments of the present disclosure, through-vias 32 are formed by plating. The respective step is shown as step 304 in the process flow shown in FIG. 16. Through-vias 32 are used for electrically inter-coupling features on the opposite ends of through-vias 32. The plating of through-vias 32 may include forming a blanket seed layer (not shown) over layer 28 and extending into openings 30, forming and patterning a photo resist (not shown), and plating through-vias 32 on the portions of the seed layer that are exposed through the openings in the photo resist. The photo resist and the portions of the seed layer that were covered by the photo resist are then removed. The material of through-vias 32 may include copper, aluminum, or the like. Through-vias 32 have the shape of rods. The top-view shapes of through-vias 32 may be circles, rectangles, squares, hexagons, or the like. In accordance with some embodiments of the present disclosure, through-vias 32 are arranged to align to a ring (in the top view of the structure in FIG. 4) encircling a region therein, wherein the region is used for placing device die 36 (FIG. 5). The top-view shapes of through-vias 32A and 32B may be selected from circles, hexagons, ellipses, squares, or the like.

Throughout the description, through-vias 32A are referred to as corner through-vias, and through-vias 32B are referred to as inner through-vias. In accordance with some embodiments of the present disclosure, through-vias 32A have the same top-view shape and the same top-view size as through-vias 32B. In accordance with alternative embodiments of the present disclosure, through-vias 32A have different top-view shapes and/or different top-view sizes than through-vias 32B.

FIG. 5 illustrates the placement of device die 36. The respective step is shown as step 306 in the process flow shown in FIG. 16. Device die 36 is adhered to dielectric layer 28 through Die-Attach Film (DAF) 45, which is an adhesive film. Device die 36 may be a logic device die including logic transistors therein. In accordance with some exemplary embodiments, device die 36 is a die designed for mobile applications and may be a Power Management Integrated Circuit (PMIC) die, a Transceiver (TRX) die, or the like. Although one device die 36 is illustrated, more device dies may be placed over dielectric layer 28.

In accordance with some exemplary embodiments, metal pillar(s) 38 (such as a copper post) are pre-formed as the topmost portion of device die 36, wherein metal pillars 38 are electrically coupled to the integrated circuit devices such as transistors (not shown) in device die 36. In accordance with some embodiments of the present disclosure, a polymer fills the gaps between neighboring metal pillars 38 to form top dielectric layer 40, wherein top dielectric layer 40 may also be on top of and contact passivation layer 42. Polymer layer 40 may be formed of PBO in accordance with some embodiments of the present disclosure. Passivation layer 42 may be formed of silicon nitride, silicon oxynitride, silicon oxide, or multi-layers thereof.

Next, molding material 44 is molded on device die 36. Molding material 44 fills the gaps between neighboring through-vias 32 and the gaps between through-vias 32 and device die 36. Molding material 44 may include a molding compound, a molding underfill, an epoxy, and/or a resin. The top surface of molding material 44 is higher than the top ends of metal pillar 38.

In a subsequent step, a planarization such as a Chemical Mechanical Polish (CMP) step or a grinding step is performed to thin molding material 44 until through-vias 32 and metal pillar 38 are exposed. The respective step is shown as step 308 in the process flow shown in FIG. 16. Due to the grinding, the top ends of through-vias 32 are substantially level (coplanar) with the top surfaces of metal pillars 38, and are substantially coplanar with the top surface of molding material 44.

Figure 6:
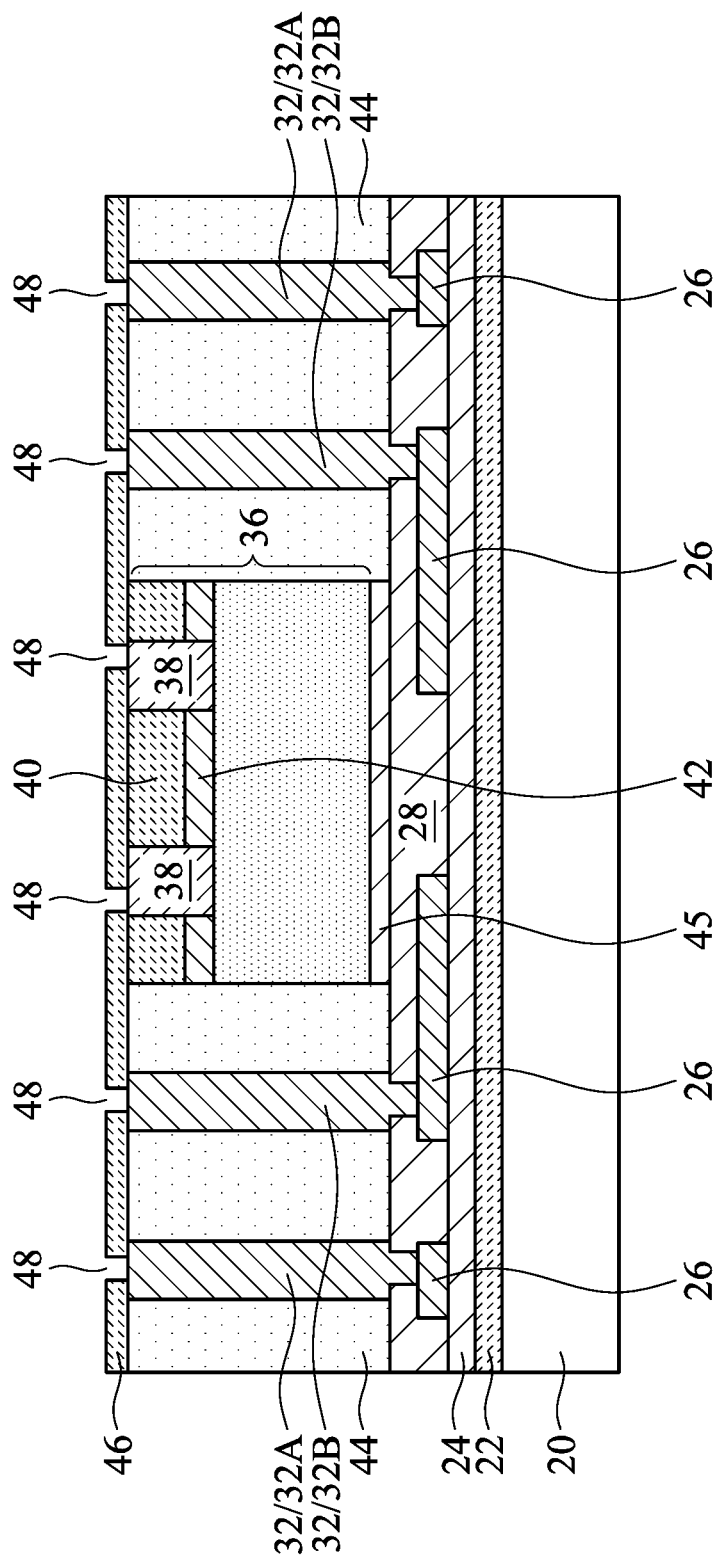

FIGS. 6 through 10 illustrate the formation of front-side RDLs and the respective dielectric layers. The respective step is shown as step 310 in the process flow shown in FIG. 16. Referring to FIG. 6, dielectric layer 46 is formed. In accordance with some embodiments of the present disclosure, dielectric layer 46 is formed of a polymer such as PBO, polyimide, or the like. In alternative embodiments, dielectric layer 46 is formed of silicon nitride, silicon oxide, or the like. Openings 48 are formed in dielectric layer 46 to expose through-vias 32 and metal pillars 38. The formation of openings 48 may be performed through a photo lithography process.

Figure 7:
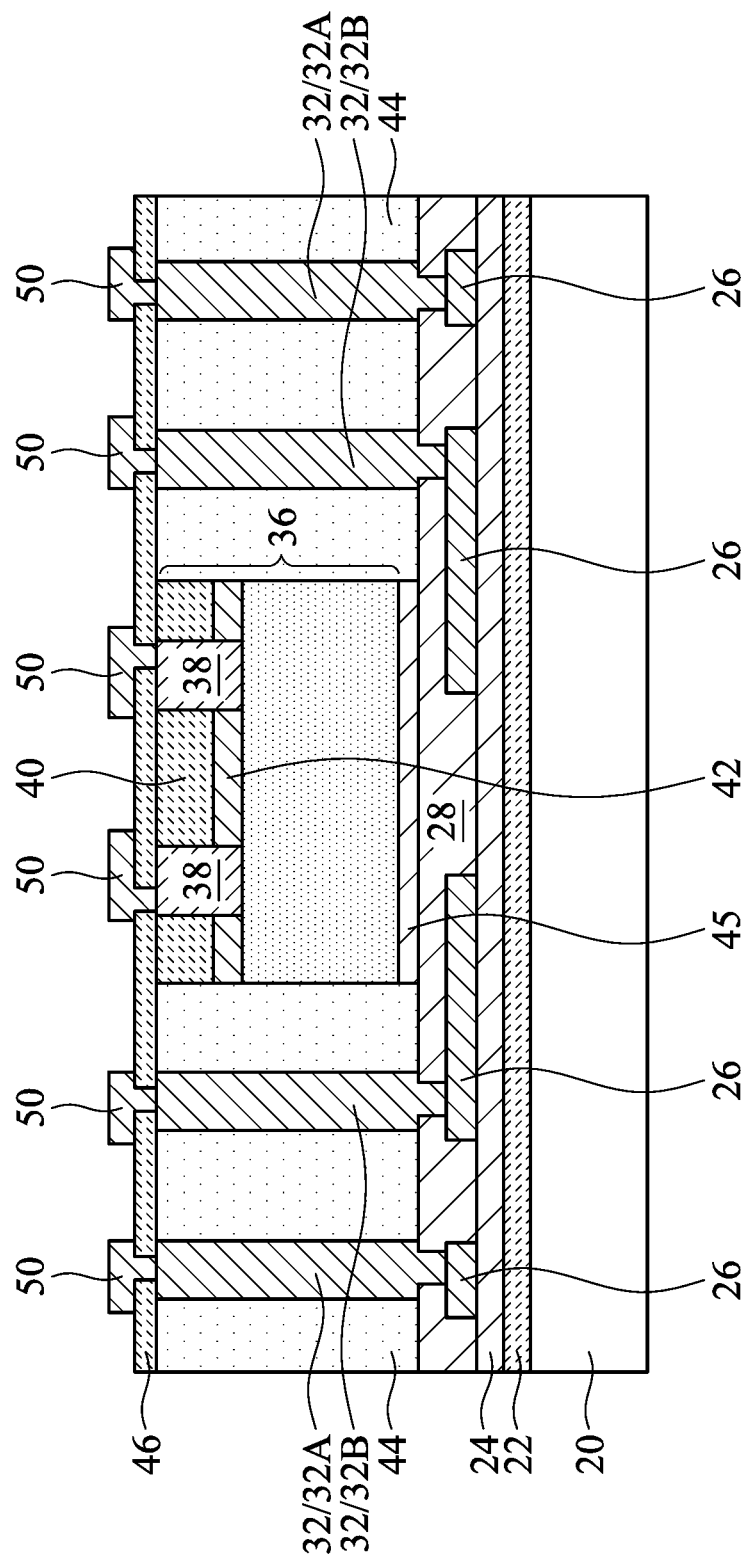

Next, referring to FIG. 7, Redistribution Lines (RDLs) 50 are formed to connect to metal pillars 38 and Through-vias 32. RDLs 50 may also interconnect metal pillars 38 and Through-vias 32. RDLs 50 include metal traces (metal lines) over dielectric layer 46 and vias extending into dielectric layer 46. The vias in RDLs 50 are connected to Through-vias 32 and metal pillars 38. In accordance with some embodiments of the present disclosure, RDLs 50 are formed in a plating process, wherein each of RDLs 50 includes a seed layer (not shown) and a plated metallic material over the seed layer. The seed layer and the plated material may be formed of the same material or different materials.

Figure 8:
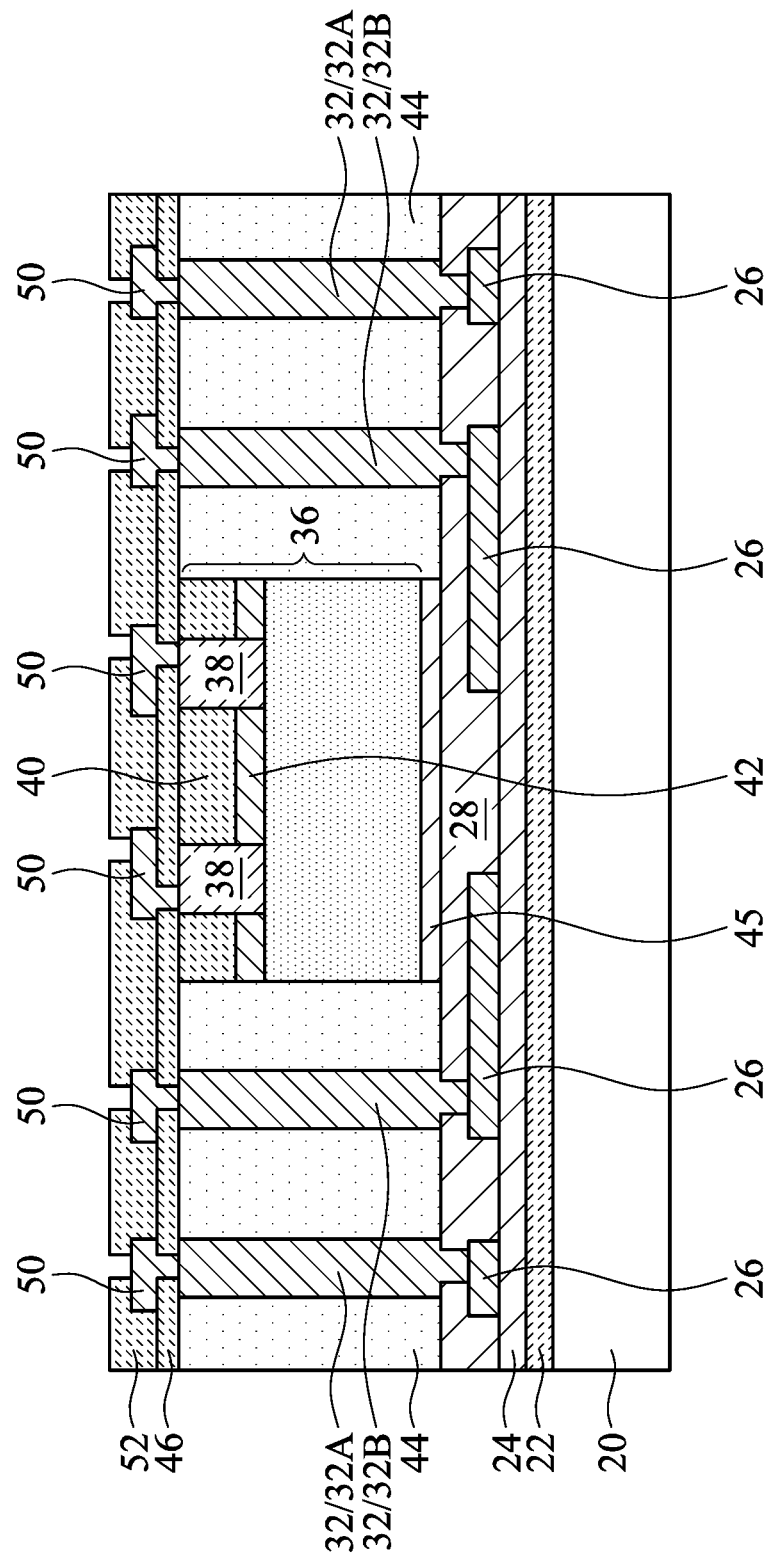
Figure 9:
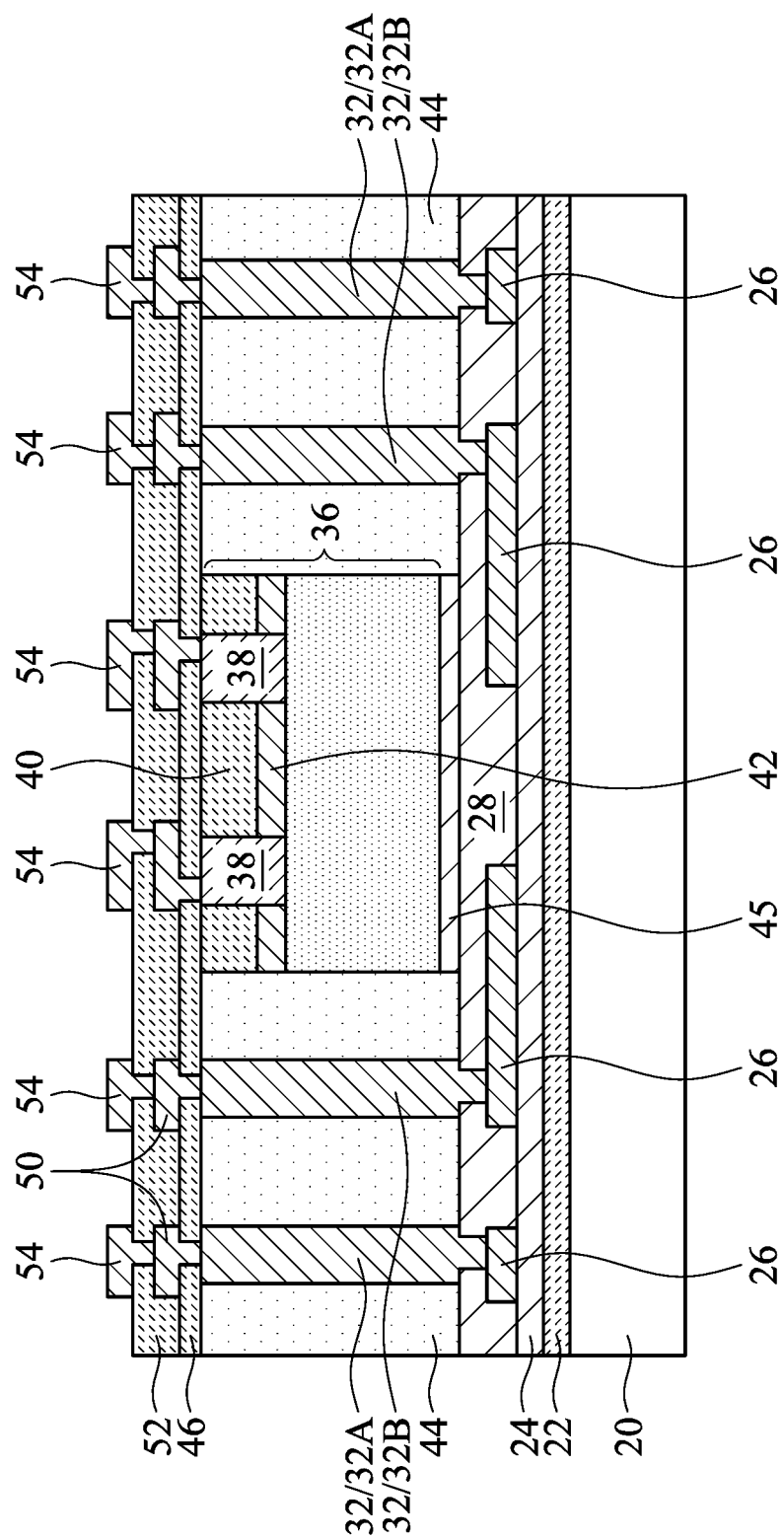

Referring to FIG. 8, in accordance with various embodiments, dielectric layer 52 is formed over the structure shown in FIG. 7, followed by the formation of RDLs 54 in dielectric layer 52, as shown in FIG. 9. In accordance with some embodiments of the present disclosure, the formation of RDLs 54 includes forming a blanket copper seed layer, forming and patterning a mask layer over the blanket copper seed layer, performing a plating to form RDLs 54, removing the mask layer, and performing an etching step to remove the portions of the blanket copper seed layer not covered by RDLs 54. RDLs 54 may be formed of a metal or a metal alloy including aluminum, copper, tungsten, and/or alloys thereof.

FIGS. 8 and 9 illustrate the formation of one RDL layer 54 in accordance with some exemplary embodiments. In accordance with alternative embodiments, there may be more than one layer of RDLs 54, depending on the routing requirement of the respective package. Dielectric layer 52 in these embodiments may comprise polymers such as PBO, polyimide, BCB, or the like. Alternatively, dielectric layer 52 may include non-organic dielectric materials such as silicon oxide, silicon nitride, silicon carbide, silicon oxynitride, or the like.

Figure 10:
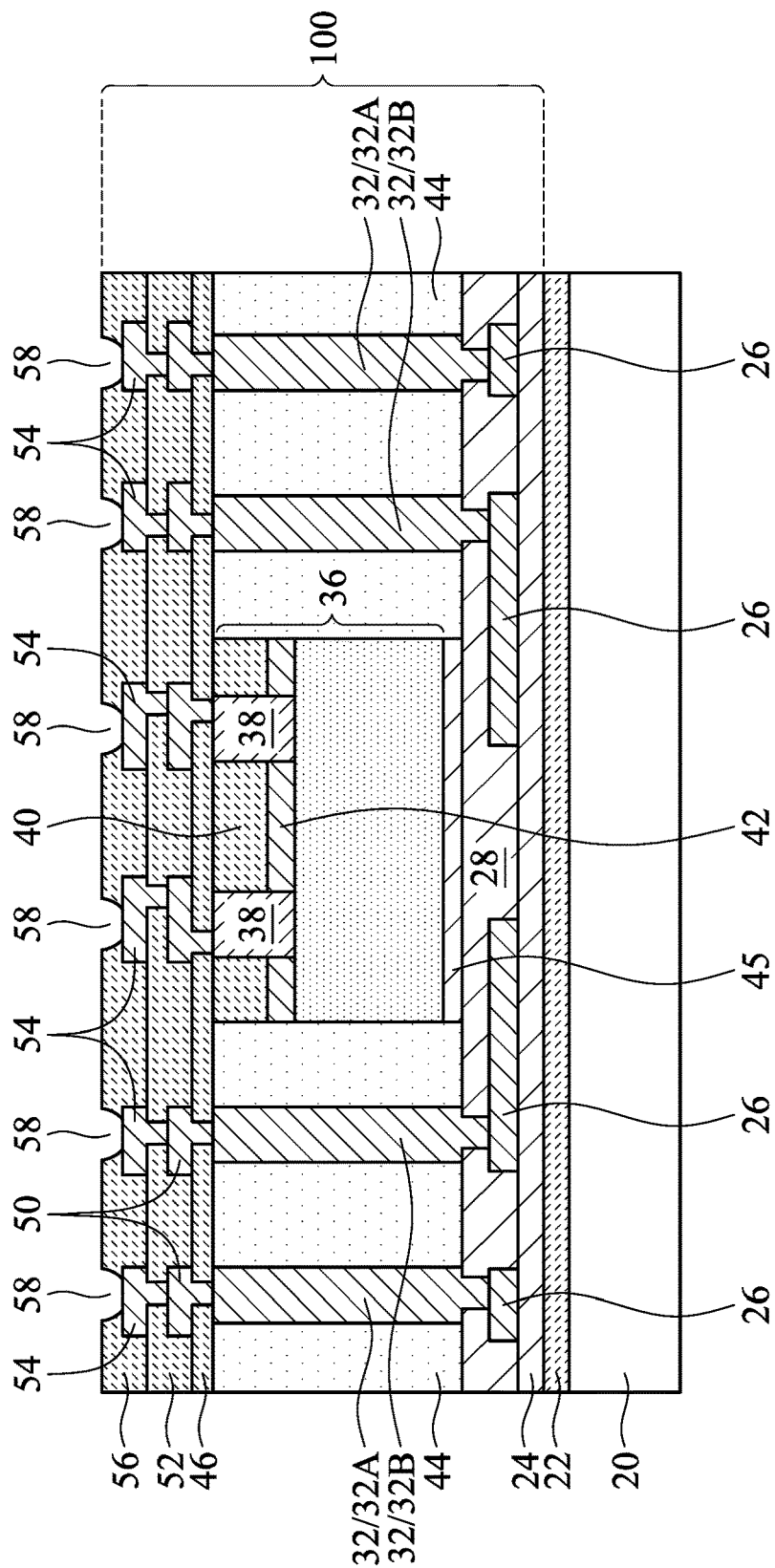
Figure 11A:
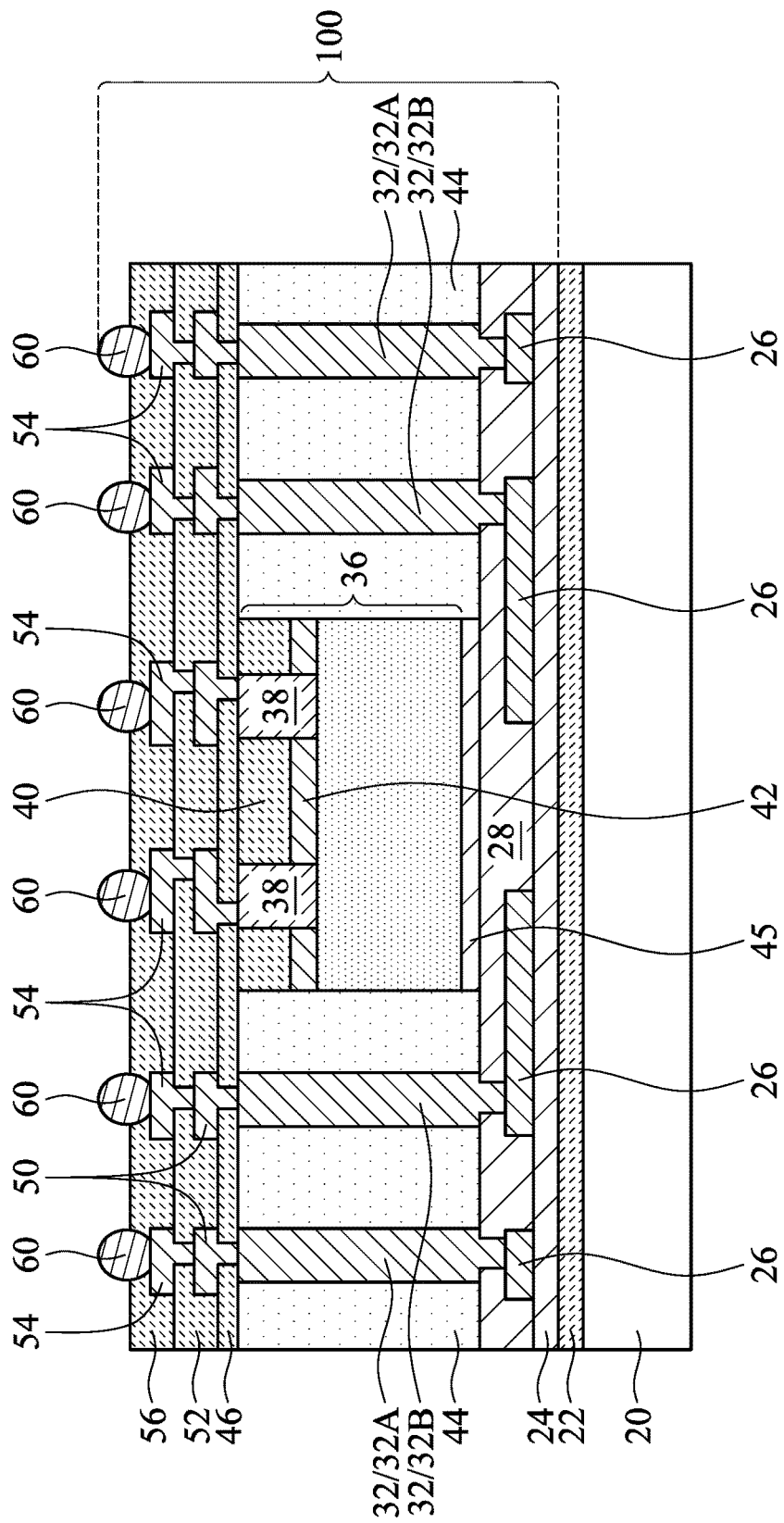

FIGS. 10 and 11A illustrates the formation of dielectric layer 56 and electrical connectors 60 in accordance with some exemplary embodiments. The respective step is shown as step 312 in the process flow shown in FIG. 16. Referring to FIG. 10, dielectric layer 56 is formed, for example, using PBO, polyimide, or BCB. Openings 58 are formed in dielectric layer 56 to expose the underlying metal pads, which are parts of RDLs 54. Electrical connectors 60 are then formed, as shown in FIG. 11A. In some embodiment, Under-Bump Metallurgies (UBMs, not shown) may be formed to extend into openings 58. The formation of electrical connectors 60 may include placing solder balls on the exposed portions of the UBMs and then reflowing the solder balls. In alternative embodiments, the formation of electrical connectors 60 includes performing a plating step to form solder regions over the exposed metal pads in RDLs 54 and then reflowing the solder regions. Electrical connectors 60 may also include metal pillars, or metal pillars and solder caps, which may also be formed through plating. Throughout the description, the structure including dielectric layer 24 and the overlying structure in combination is referred to as package 100, which is a composite wafer.

Figure 11B:
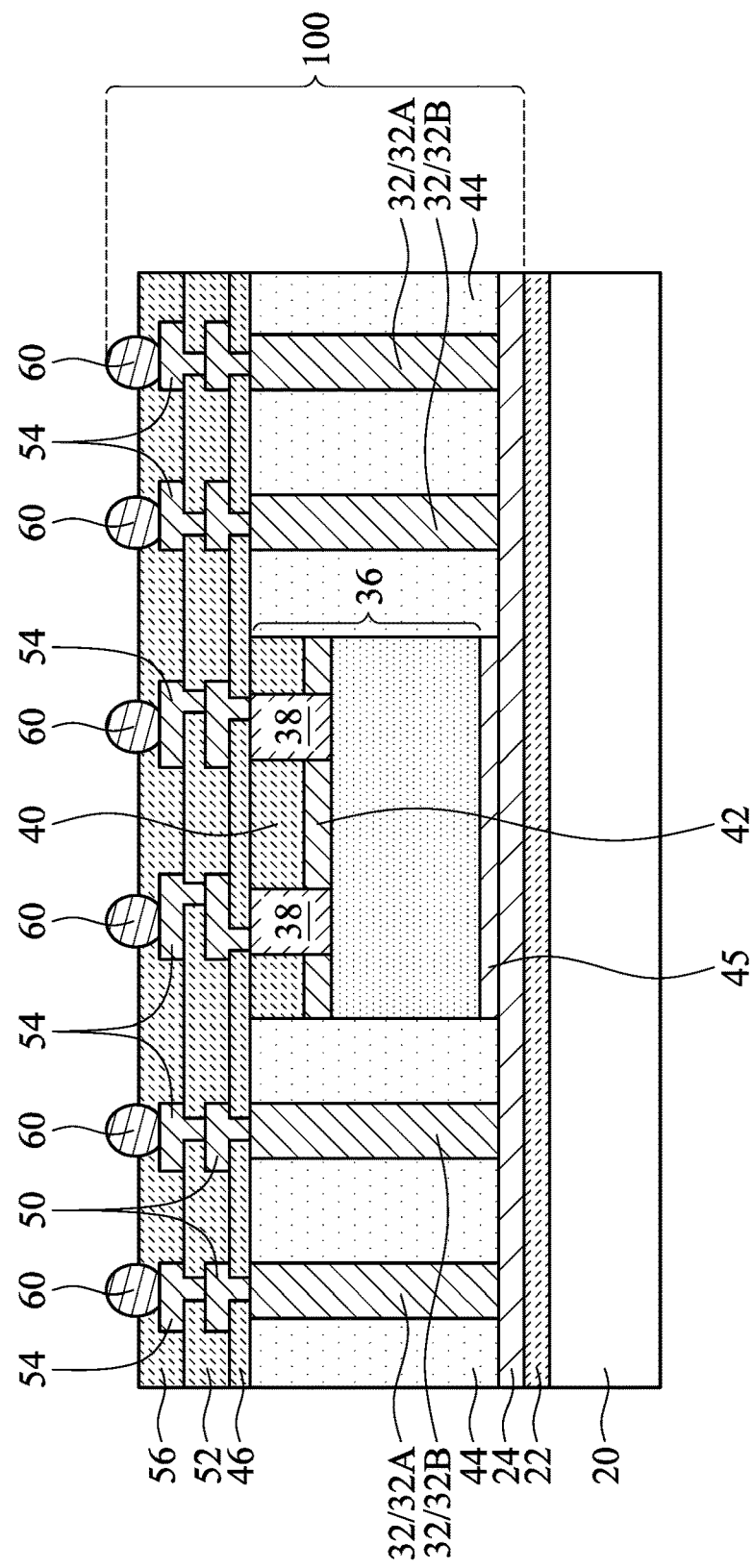

FIG. 11B illustrates the cross-sectional view of package 100 in accordance with alternative embodiments. In these embodiments, the process steps as shown in FIGS. 2 and 3 are skipped. Accordingly, in FIG. 11B, no backside RDL is formed. Through-vias 32 are formed from dielectric layer 24. Molding material 44 and DAF 45 are also attached to dielectric layer 24.

Figure 12:
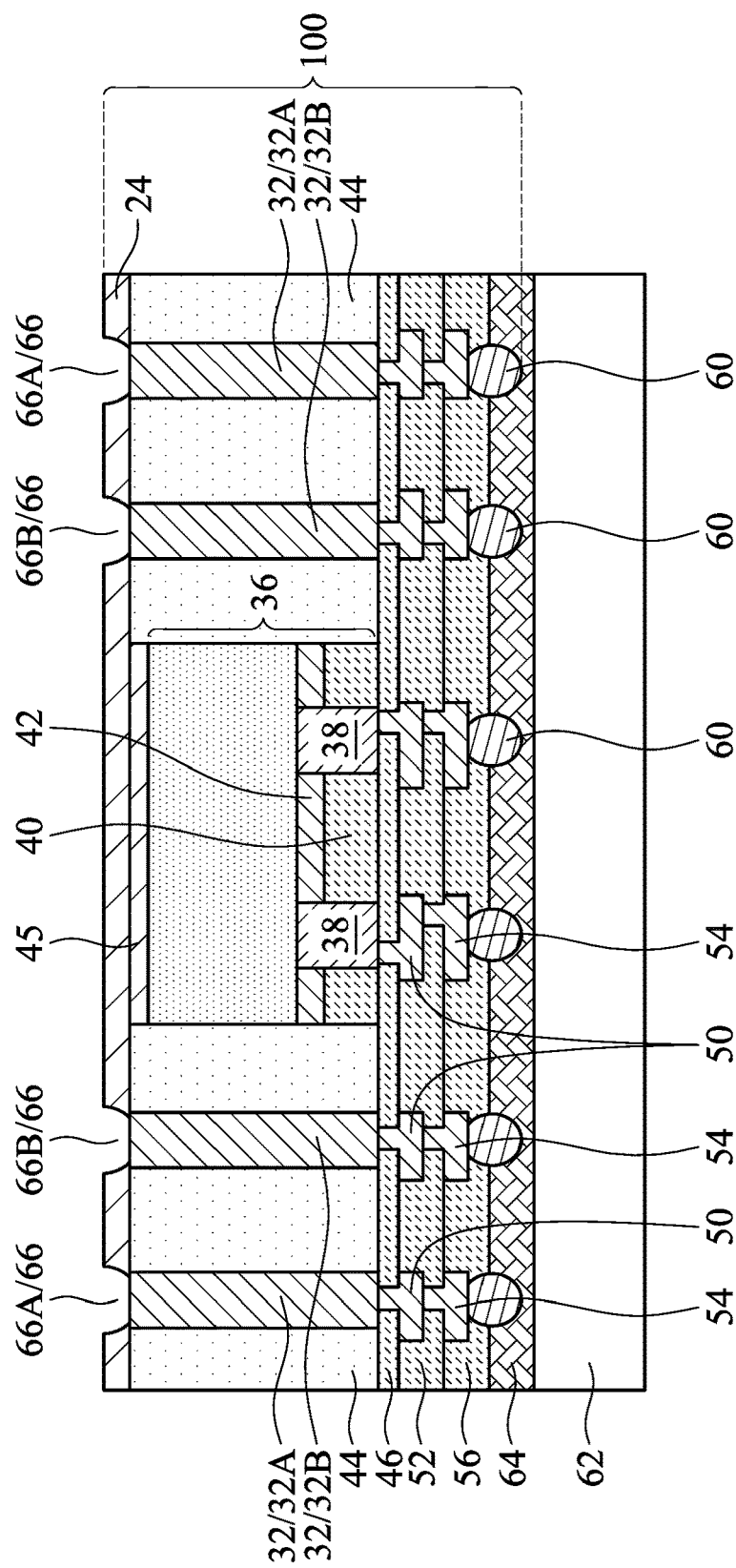

FIGS. 12 through 14A illustrate the remaining process in the formation of a package, wherein the process continues from the structure shown in FIG. 11B. First, package 100 is de-bonded from carrier 20 (FIG. 11B), for example, by projecting a UV light or a laser on release layer 22, so that release layer 22 decomposes under the heat of the UV light or the laser. The resulting structure is shown in FIG. 12. Package 100 is further adhered to carrier 62 through adhesive layer 64, wherein electrical connectors 60 may face toward, and may contact, adhesive 64. In accordance with some embodiments of the present disclosure, carrier 62 is attached to package 100 before the detaching of carrier 20.

FIG. 12 illustrates the removal of some parts of dielectric layer 24 to expose through-vias 32. As a result, openings 66 are formed in dielectric layer 24. The respective step is shown as step 314 in the process flow shown in FIG. 16. The formation of openings 66 may be achieved through laser burning. Alternatively, when dielectric layer 24 is formed of a light-sensitive material such as PBO or polyimide, the formation of openings 66 may also be achieved through etching. Openings 66 include corner openings 66A over corner through-vias 32A and inner openings 66B over inner through-vias 32B.

Figure 13:
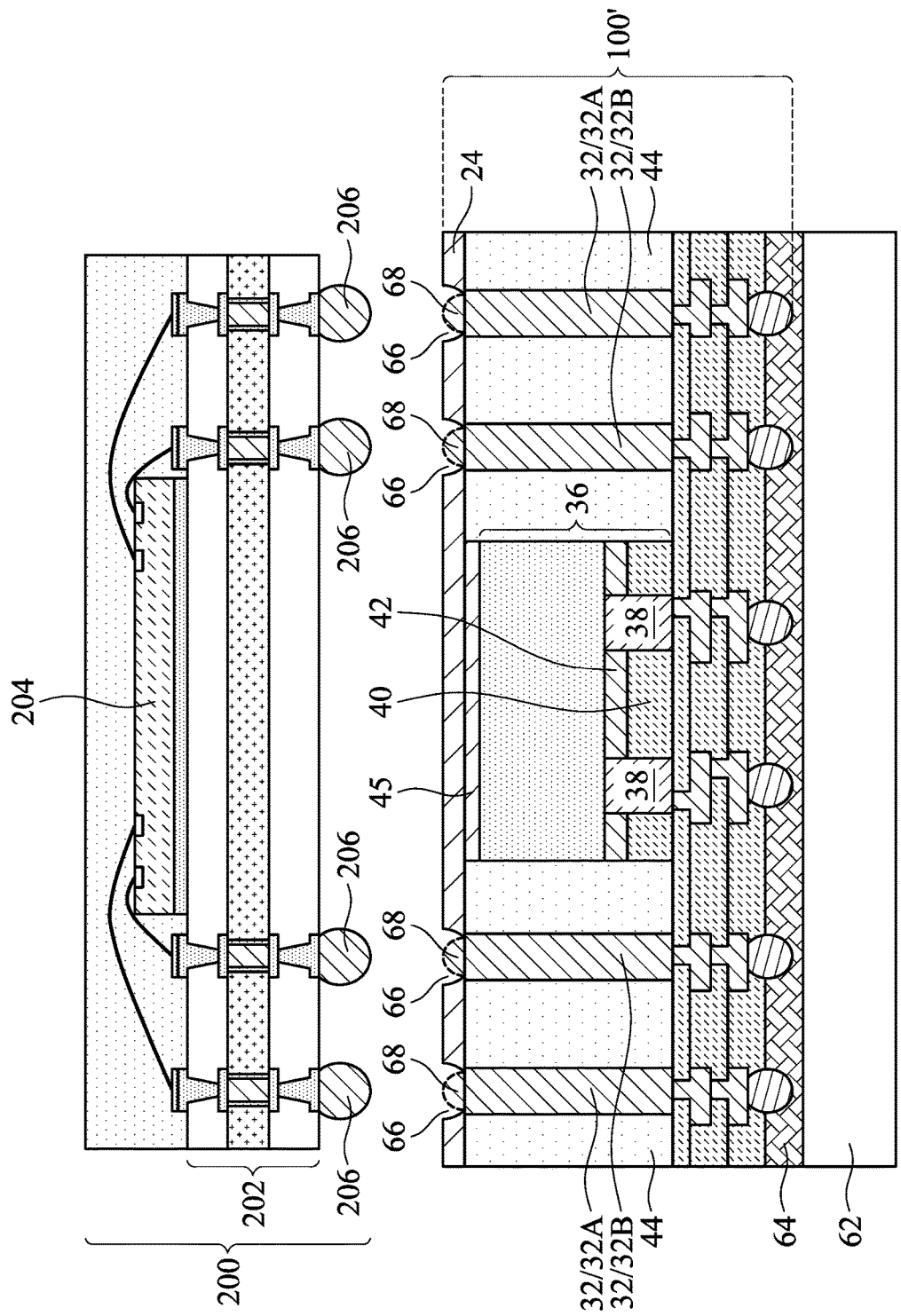

FIG. 13 illustrates the formation of solder regions 68 (sometimes referred to as pre-solder regions) in accordance with some exemplary embodiments. For example, a printing step may be performed to print a solder paste in openings 66 to form solder regions 68. In alternative embodiments, no pre-solder regions are formed in openings 66. Package 100 (the composite wafer) may then be sawed apart into a plurality of packages 100', each having the structure as shown in FIG. 13.

Figure 14A:
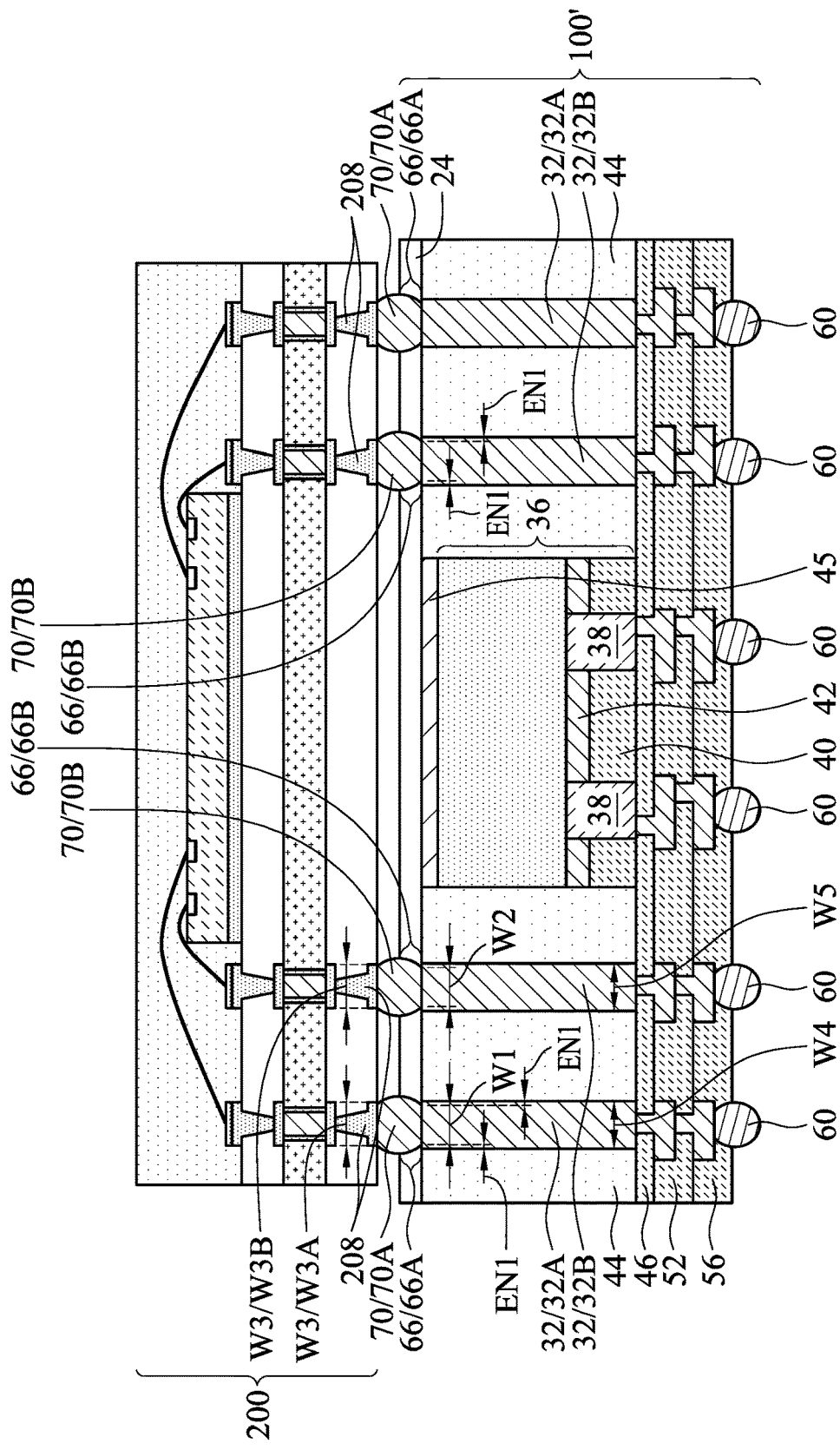

Also shown in FIG. 13 is package 200, which is alternatively referred to as a top package. As shown in FIG. 14A, package 200 is bonded to package 100'. The respective step is shown as step 316 in the process flow shown in FIG. 16. In accordance with some embodiments of the present disclosure, package 200 includes package substrate 202, and device die(s) 204 bonded to package substrate 202. The bonding of device dies 204 to package substrate 202 may be achieved through wire bonding, flip-chip bonding, or the like. Solder regions 206 and solder regions 68 as shown in FIG. 13 are reflowed to form solder regions 70, which bond package 200 to package 100'. In some embodiments, after the bonding of package 200, an underfill (not shown) is filled into the gap between package 100' and package 200.

Figure 14B:
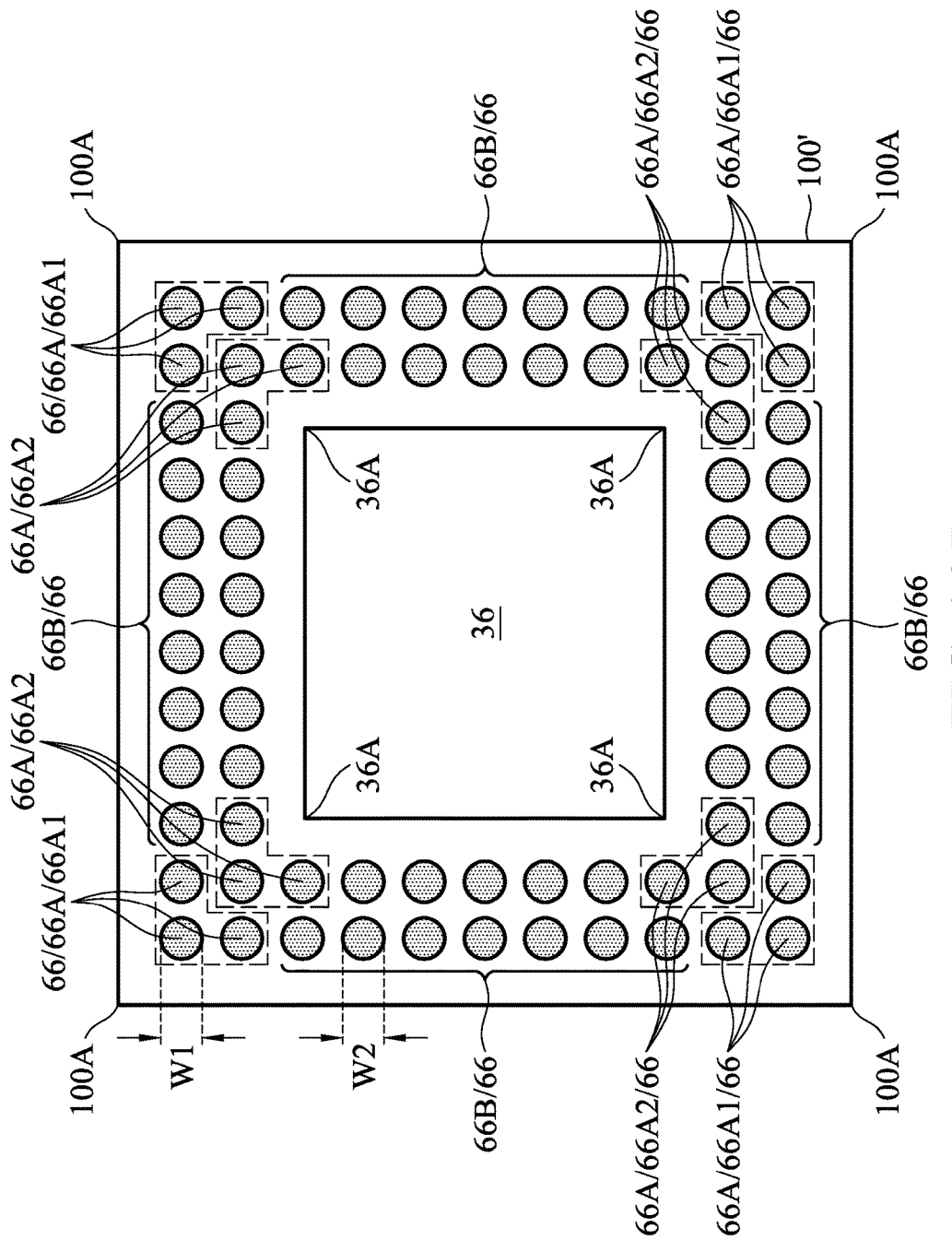
FIG. 14B is a top-view of an exemplary package in accordance with some embodiments.

FIG. 14B illustrates a top view of the package shown in FIG. 14A, wherein the top view is obtained at the level of openings 66 (also refer to FIG. 13), in which solder region 70 (FIG. 14A) will subsequently be located. Referring to FIG. 14B, openings 66 includes corner openings 66A (also denoted as 66A1), which are the openings closest to respective corners 100A of package 100. There may be one, two, or three corner openings 66A close to each of corners 100A, depending on the stress suffered by solder regions 70. Openings 66 also include corner openings 66A2, which are the openings closest to respective corners 36A of device die 36. The remaining openings 66 other than corner openings 66A are referred to as inner openings 66B.

In accordance with some embodiments of the present disclosure, the areas and the lateral dimensions W1 of corner openings 66A are greater than the areas and the lateral dimensions W2, respectively, of inner openings 66B. Throughout the description, the greatest lateral dimensions of openings 66 are referred to as the denoted lateral dimension W1/W2/W3/W4/W5 in FIGS. 14A and 14B. When the respective features have rounded top-view shapes, lateral dimensions W1 through W5 may be diameters. The interface areas between corner solder regions 70A (FIG. 14A) and the underlying corner through-vias 32A are greater than the interface areas between inner solder regions 70B and the underlying inner through-vias 32B. Since corner solder regions 70A suffer from higher stresses than inner solder regions 70B, cracks are more likely to occur between corner solder regions 70A and corner through-vias 32A. By increasing the interface areas between corner solder regions 70A and corner through-vias 32A to greater than the interface areas between inner solder regions 70B and inner through-vias 32B, the stress suffered at the interface areas of corner solder regions 70A is reduced, and the reliability of the respective package is improved.

Referring back to FIG. 14B, the ratio W1/W2 of lateral dimensions may be in the range between about 1.1 and about 1.5. Furthermore, referring to FIG. 14A, solder regions 70 contact metal pads 208 in package 200, with the lateral dimension of the contact area (the lateral size of exposed metal pads 208) being W3. In accordance with some embodiments, ratio W2/W3 is smaller than or equal to 0.8, and may be in the range between about 0.7 and 0.8. Ratio W1/W3 is greater than ratio W2/W3. For example, ratio W1/W3 may be greater than 0.8, and may be in the range between about 0.9 and 1.3. Widths W3 throughout package 200 maybe the same in accordance with some embodiments.

To ensure that molding material 44 is not exposed to openings 66 in the formation of openings 66 (FIG. 12), a margin EN1 is left on each side of openings 66, wherein margin EN1 may be in the range between about 10 μm and about 30 μm on each side if the respective opening 66 is aligned to the center of underlying through-vias 32. In the embodiments wherein corner openings 66A are greater than inner openings 66B, lateral dimension W1 of corner through-vias 32A may be greater than lateral dimension W2 of inner through-vias 32A to ensure that enough margin is left for corner openings 66A. For example, lateral dimension W5 may be equal to (2×EN1+(0.7~0.8)×W3B), and lateral dimension W4 may be equal to (2×EN1+(0.9~1.3)×W3A). Lateral dimension W1 of corner through-vias 32A may also be larger than the lateral dimension W2, providing corner openings 66A have enough margin EN1.

Referring to FIG. 14B again, the stress suffered by the solder regions in corner openings 66A2 may be greater than the stress suffered by the inner solder regions 70B in inner openings 66B. Furthermore, the stress suffered by the solder regions in corner openings 66A2 may be smaller than the stress suffered by the solder regions in corner openings 66A1. Accordingly, the lateral dimensions W1 of corner openings 66A2 are greater than the lateral dimensions W2 of inner openings 66B, and may be smaller than the lateral dimensions (also W1) of corner openings 66A1.

In accordance with alternative embodiments, the lateral dimensions W1 of corner openings 66A are designed to be the same as lateral dimensions W2 of inner openings 66B. On the other hand, lateral dimension W3A (FIG. 14A) of the metal pads 208 corresponding to corner openings 66A are reduced to be smaller than lateral dimension W3B of the metal pads 208 corresponding to inner openings 66B, so that ratio W1/W3A is still greater than ratio W2/W3B. In these embodiments, ratios W1/W3 and W2/W3 may be in the same range as in the embodiments wherein lateral dimension W1 is greater than lateral dimension W2. By reducing lateral dimension W3A, the stresses suffered by corner solder regions 70A are redistributed, and some stress suffered by corner solder regions 70A are redistributed from the interface with through-vias 32A to the interface with metal pads 208. The solder cracking on solder regions 70A is thus reduced.

Referring to FIG. 14A, in accordance with some embodiments of the present disclosure, solder regions 70A have solder volumes equal to the solder volumes of solder regions 70B. In accordance with alternative embodiments of the present disclosure, solder regions 70A have solder volumes greater than the solder volumes of solder regions 70B, for example, when lateral dimension W1 is greater than lateral dimension W2.

Figure 15A:
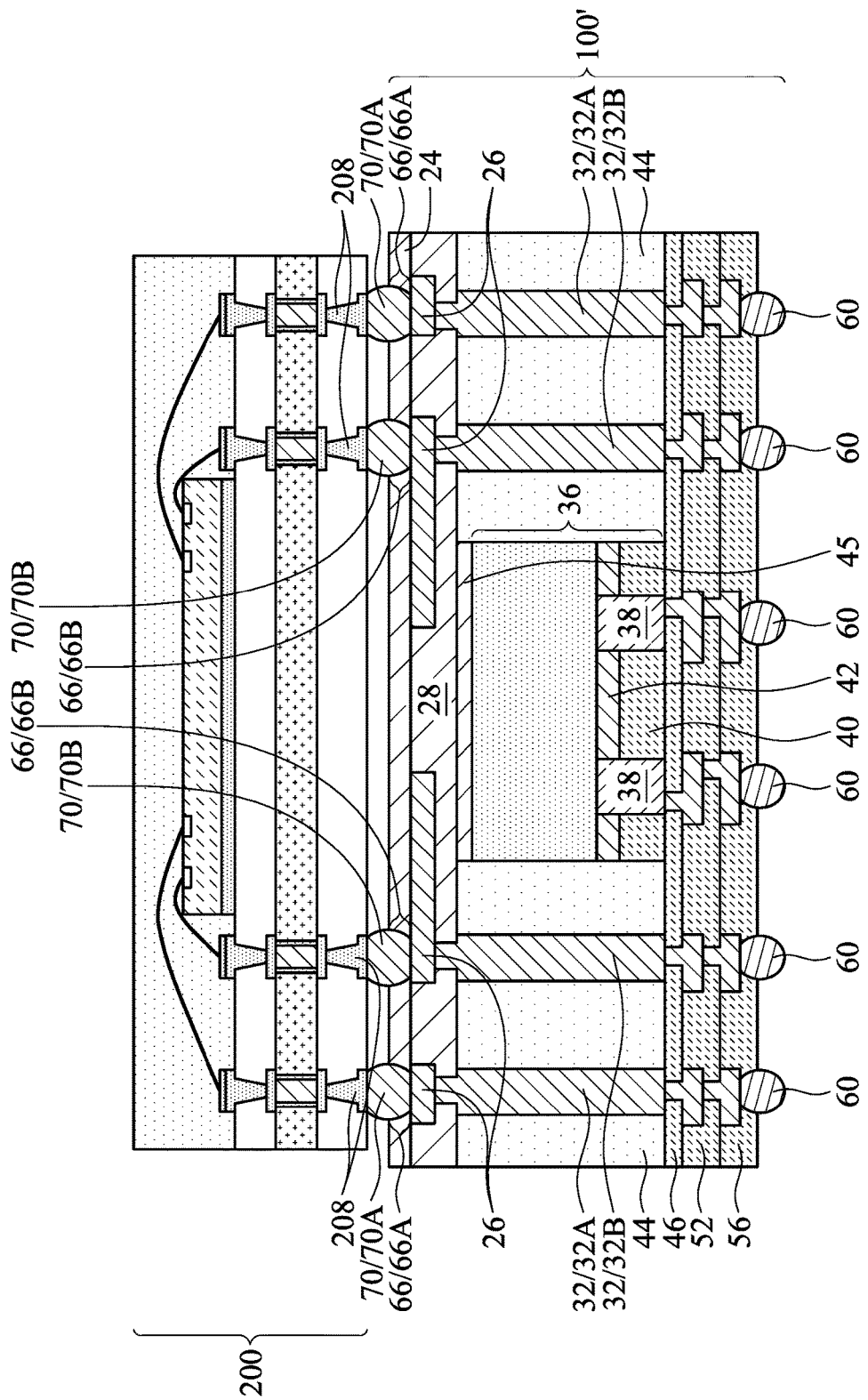
FIG. 15A illustrates a cross-sectional view of a package in accordance with alternative embodiments.

FIG. 15A illustrates a package in accordance with alternative embodiments of the present disclosure. Unless specified otherwise, the materials and the formation methods of the components in these embodiments are essentially the same as the like components, which are denoted by like reference numerals in the embodiments shown in FIGS. 12 through 14A. The details regarding the formation process and the materials of the components shown in FIG. 15A may thus be found in the discussion of the embodiment shown in FIGS. 12 through 14A. The process in accordance with these embodiments continues from the structure shown in FIG. 11A, which differs from FIG. 11B in that the structure in FIG. 11A includes dielectric layer 28, RDLs 26, and the vias in dielectric layer 28.

Figure 15B:
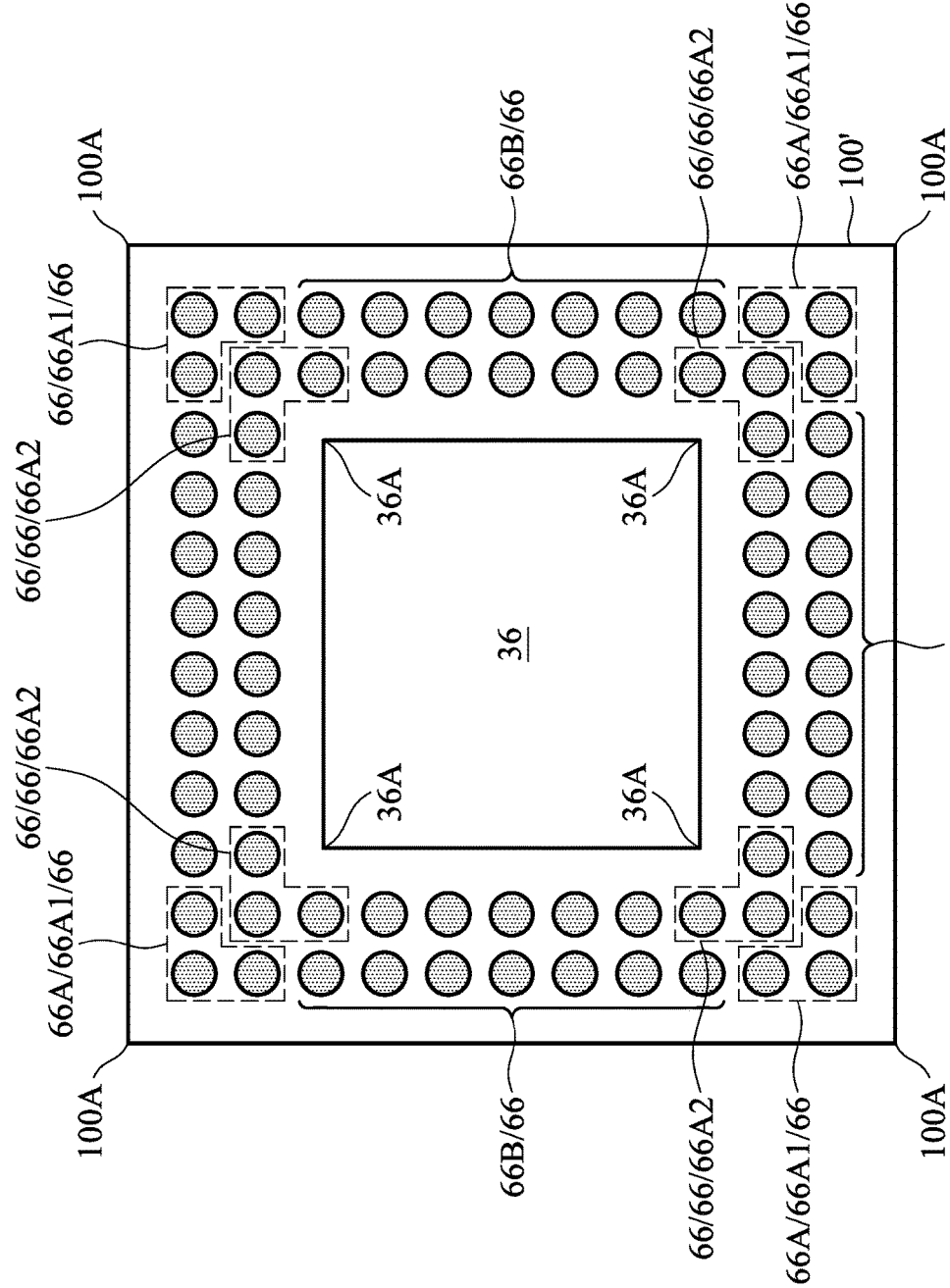
FIGS. 15B and 15C are top-views of an exemplary package in accordance with some embodiments.
Figure 15:
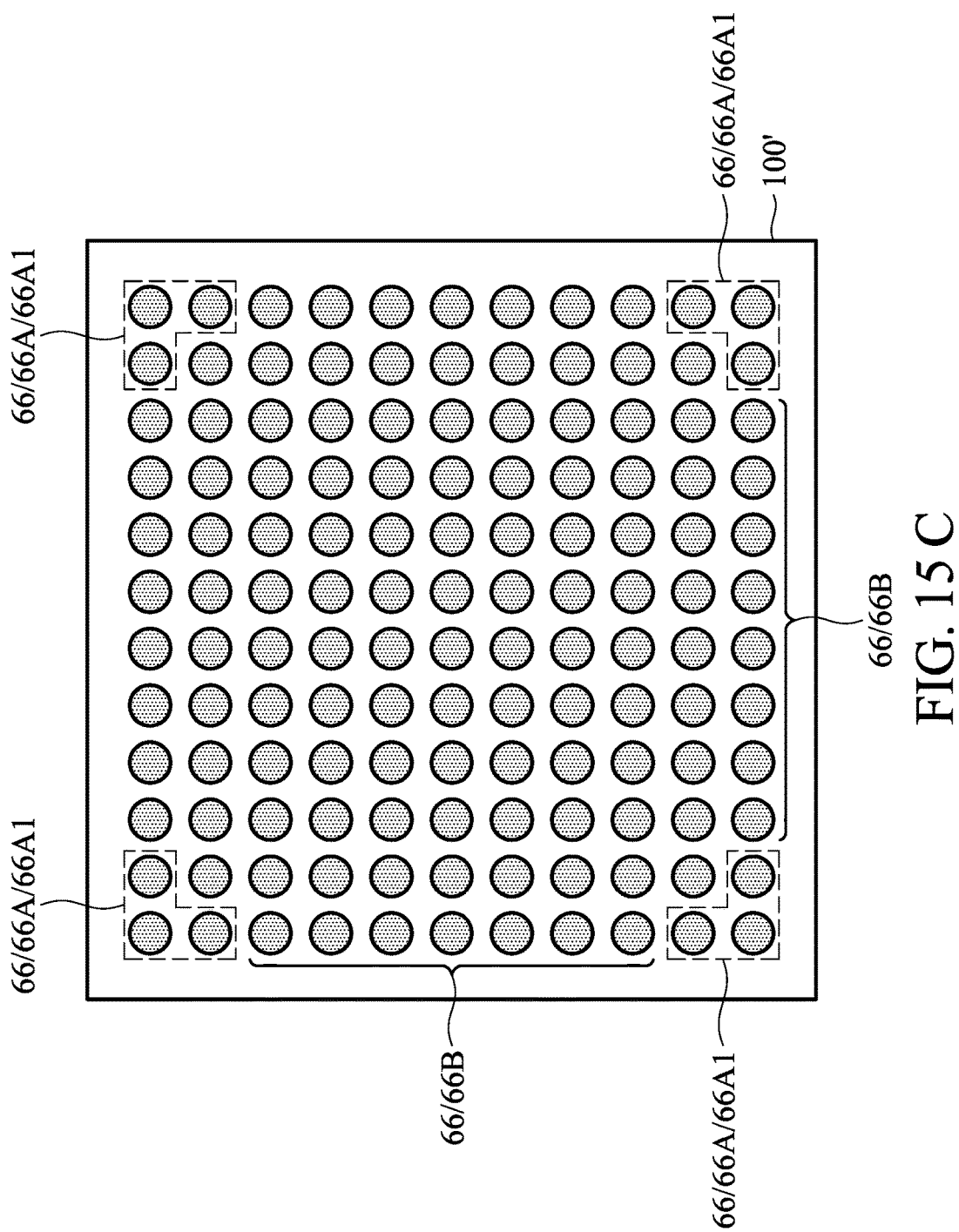

As shown in FIG. 15A, solder regions 70A and 70B, which are disposed in corner openings 66A and inner openings 66B, respectively, are used to bond package 200 to package 100'. FIG. 15B illustrates a top view of corner openings 66A and inner openings 66B, which are essentially the same as what is shown in FIG. 14B. FIG. 15C illustrates the top views of the corner openings 66A and inner openings 66B in accordance with yet alternative embodiments. In these embodiments, openings 66 are distributed as a full array. According, no corner openings 66A2 as in FIG. 14B exist in the embodiment illustrated in FIG. 15C.

In accordance with some embodiments of the present disclosure, the discussion regarding the lateral widths W1, W2, W3, W4, and W5, ratios W1/W3 and W2/W3, and the margin EN1 regarding the embodiments in FIGS. 13, 14A, and 14B also applies to the embodiments shown in FIGS. 15A, 15B, and 15C, and hence are not repeated herein.

The embodiments of the present disclosure have some advantageous features. By adjusting the lateral dimensions, areas, and/or the ratios W1/W3 and W2/W3, the high stress applied on corner solder regions may be redistributed, and hence the weak portions of the package are strengthened. The reliability of the package is thus improved.

In accordance with some embodiments of the present disclosure, a package includes a device die, a molding material molding the device die therein, and a surface dielectric layer at a surface of the package. A corner opening is in the surface dielectric layer. The corner opening is adjacent to a corner of the package. An inner opening is in the surface dielectric layer. The inner opening is farther away from the corner of the package than the corner opening. The corner opening has a first lateral dimension greater than a second lateral dimension of the inner opening.

In accordance with alternative embodiments of the present disclosure, a package includes a first package and a second package bonded to the first package. The first package includes a device die, a molding material encapsulating the device die therein, a surface dielectric layer at a surface of the first package, and a corner opening and an inner opening in the surface dielectric layer. The corner opening is adjacent to a corner of the first package and has a first lateral dimension. The inner opening is farther away from the corner of the first package than the corner opening, and has a second lateral dimension. The second package has first conductive feature having a third lateral dimension, and a second conductive feature having a fourth lateral dimension. A first ratio of the first lateral dimension to the third lateral dimension is greater than a second ratio of the second lateral dimension to the fourth lateral dimension. A corner solder region is bonded to the first conductive feature, extending into the corner opening, and in contact with the first conductive feature. An inner solder region is bonded to the second conductive feature, extending into the inner opening, and in contact with the second conductive feature.

In accordance with alternative embodiments of the present disclosure, a package includes a device die, a molding material molding the device die therein, and a first through-via and a second through-via penetrating through the molding material. The first through-via has a first lateral dimension greater than a second lateral dimension of the second through-via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
a first package comprising:
  a device die;
  a molding material molding the device die therein;
  a surface dielectric layer at a surface of the first package;
  a corner opening in the surface dielectric layer, wherein the corner opening is adjacent to a corner of the first package; and
  an inner opening in the surface dielectric layer, wherein the inner opening is farther away from the corner of the first package than the corner opening, and the corner opening has a first lateral dimension greater than a second lateral dimension of the inner opening;
  a corner solder region extending into the corner opening; and
  an inner solder region having a solder therein extending into the inner opening.

2. The package of claim 1 further comprising a second package comprising:
  a first conductive feature bonded to the corner solder region; and
  a second conductive feature bonded to the inner solder region.

3. The package of claim 2, wherein a first ratio of the first lateral dimension to a lateral dimension of the first conductive feature is greater than a second ratio of the second lateral dimension to a lateral dimension of the second conductive feature.

4. The package of claim 1, wherein the first package further comprises:
  a corner through-via penetrating through the molding material, wherein the corner through-via is in contact with the corner solder region; and
  an inner through-via penetrating through the molding material, wherein the inner through-via is in contact with the inner solder region.

5. The package of claim 4, wherein the corner solder region is in physical contact with the corner through-via, and the inner solder region is in physical contact with the inner through-via.

6. The package of claim 1 further comprising:
  a corner through-via penetrating through the molding material, wherein a top surface of the corner through-via is exposed to the corner opening; and
  an inner through-via penetrating through the molding material, wherein a top surface of the inner through-via is exposed to the inner opening, and the corner through-via has a lateral dimension greater than a lateral dimension of the inner through-via.

7. The package of claim 1, wherein the corner opening has a first area greater than a second area of the inner opening.

8. The package of claim 1 further comprising an additional corner opening in the surface dielectric layer, wherein the additional corner opening is closer to an additional respective corner of the device die than all other openings in the surface dielectric layer, and the additional corner opening has a third lateral dimension greater than the second lateral dimension of the inner opening.

9. The package of claim 1, wherein the surface dielectric layer is on a backside of the device die.

10. A package comprising:
a first package comprising:
  a device die;
  a molding material molding the device die therein;
  a surface dielectric layer at a surface of the first package;
  a corner opening in the surface dielectric layer, wherein the corner opening is proximal a corner of the first package and has a first lateral dimension; and
  an inner opening in the surface dielectric layer, wherein the inner opening is distal the corner of the first package than the corner opening, and the inner opening has a second lateral dimension;
a second package comprising:
  a first conductive feature having a third lateral dimension; and
  a second conductive feature having a fourth lateral dimension, wherein a first ratio of the first lateral dimension to the third lateral dimension is greater than a second ratio of the second lateral dimension to the fourth lateral dimension;
  a corner solder region bonded to the first conductive feature, extending into the corner opening, and in contact with the first conductive feature; and
  an inner solder region bonded to the second conductive feature, extending into the inner opening, and in contact with the second conductive feature.

11. The package of claim 10, wherein the corner opening has a first area greater than a second area of the inner opening.

12. The package of claim 10, wherein the first ratio is in a range between about 0.9 and about 1.3, and the second ratio is in a range between about 0.7 and about 0.8.

13. The package of claim 10 further comprising:
  a corner through-via penetrating through the molding material, wherein a top surface of the corner through-via is exposed to the corner opening; and
  an inner through-via penetrating through the molding material, wherein a top surface of the inner through-via is exposed to the inner opening, and wherein the corner through-via has a lateral dimension greater than a lateral dimension of the inner through-via.

14. The package of claim 10, wherein the third lateral dimension is equal to the fourth lateral dimension, and the first lateral dimension is greater than the second lateral dimension.

15. The package of claim 10, wherein the third lateral dimension is smaller than the fourth lateral dimension, and the first lateral dimension is equal to the second lateral dimension.

16. A package comprising:
a device die;
a molding material encapsulating the device die therein;
first conductive features overlying the molding material;
second conductive features underlying the molding material; and
a first through-via and a second through-via penetrating through the molding material and extending in a vertical direction, wherein the first through-via and the second through-via electrically connect the first conductive features to the second conductive features, wherein a first top surface of the first through-via is level with a second top surface of the second through-via, and a first bottom surface of the first through-via is level with a second bottom surface of the second through-via, wherein the first through-via has a first lateral dimension greater than a second lateral dimension of the second through-via, and the first lateral dimension and the second lateral dimension are measured at a same level.

17. The package of claim 16, wherein a ratio of the first lateral dimension to the second lateral dimension is greater than about 1.1.

18. The package of claim 16, wherein the first through-via is a corner through-via adjacent to a corner of the package, and the second through-via is an inner through-via farther away from the corner of the package than the corner through-via.

19. The package of claim 16 comprising:
a surface dielectric layer over the molding material;
a corner solder region having a first portion extending into the surface dielectric layer, wherein the corner solder region is proximal a corner of the package, and the first portion has a first lateral dimension; and
an inner solder region having a second portion extending into the surface dielectric layer, wherein the inner solder region is farther away from the corner of the package than the corner solder region, and the second portion has a second lateral dimension greater than the first lateral dimension.

20. The package of claim 16 further comprising a dielectric material, wherein the first top surface of the first through-via and the second top surface of the second through-via are both in physical contact with the dielectric material.

* * * * *